(12) United States Patent
Nitta et al.

(10) Patent No.: US 8,958,138 B2
(45) Date of Patent: Feb. 17, 2015

(54) DISPLAY DEVICE AND METHOD OF MANUFACTURING THE DISPLAY DEVICE

(75) Inventors: Hidekazu Nitta, Chiba (JP); Makoto Ohkura, Fuchu (JP); Takuo Kaitoh, Mobara (JP); Katsumi Matsumoto, Mobara (JP)

(73) Assignee: Pixtronix, Inc., San Diego, CA (US)

( * ) Notice: Subject to any disclaimer, the term of this patent is extended or adjusted under 35 U.S.C. 154(b) by 213 days.

(21) Appl. No.: 13/483,095

(22) Filed: May 30, 2012

(65) Prior Publication Data

US 2012/0307334 A1    Dec. 6, 2012

(30) Foreign Application Priority Data

Jun. 2, 2011    (JP) .................................. 2011-124295

(51) Int. Cl.
*G02B 26/02* (2006.01)
*G02B 26/08* (2006.01)
*B81B 3/00* (2006.01)

(52) U.S. Cl.
CPC ............ *G02B 26/085* (2013.01); *B81B 3/0072* (2013.01); *B81B 2201/045* (2013.01); *B81C 2201/0167* (2013.01)
USPC ...................................................... 359/230

(58) Field of Classification Search
CPC ....... G02B 26/02; G02B 26/04; G02B 26/085
USPC ......................................... 359/230, 231, 290
See application file for complete search history.

(56) References Cited

U.S. PATENT DOCUMENTS

2005/0130360 A1    6/2005    Zhan
(Continued)

FOREIGN PATENT DOCUMENTS

| CN | 101995655 A | 3/2011 |
| JP | H05241191 A | 9/1993 |
| JP | 2008-197668 | 8/2008 |

(Continued)

OTHER PUBLICATIONS

Taiwan Search Report—TW101114013—TIPO—May 13, 2014.
(Continued)

*Primary Examiner* — Euncha Cherry
(74) *Attorney, Agent, or Firm* — Edward A. Gordon; Foley & Lardner LLP

(57) ABSTRACT

In a movable shutter-system display device, a movable shutter includes an amorphous silicon film material which has a low residual stress and thus is stable. A display device includes a display panel comprising a first substrate and a second substrate. The display panel includes a plurality of pixels; each of the plurality of pixels includes a movable shutter including amorphous silicon and a driving circuit for driving the movable shutter; and the amorphous silicon included in the movable shutter is formed of at least two amorphous silicon films, and where any two amorphous silicon films adjacent to each other among the at least two amorphous silicon films are a first amorphous silicon film and a second amorphous silicon film stacked on the first amorphous silicon film, the first amorphous silicon film and the second amorphous silicon film have different characteristic values.

11 Claims, 14 Drawing Sheets

(56) References Cited

U.S. PATENT DOCUMENTS

2008/0158635 A1  7/2008  Hagood et al.
2010/0007942 A1  1/2010  Oikawa et al.
2006/0110895 A1  5/2006  Ouellet et al.
2006/0250325 A1  11/2006  Hagood et al.
2007/0223080 A1  9/2007  Hagood et al.

FOREIGN PATENT DOCUMENTS

WO   WO 2006/091738 A1   8/2006
WO   WO 2009/102471      8/2009

OTHER PUBLICATIONS

European Search Report—EP12170724—Search Authority—Munich—Sep. 6, 2012.

Fig.8
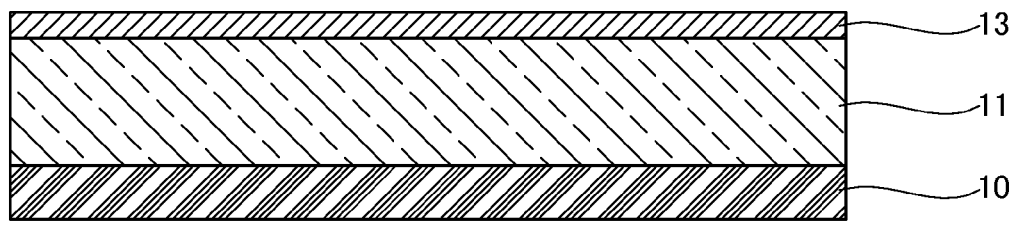
(a)
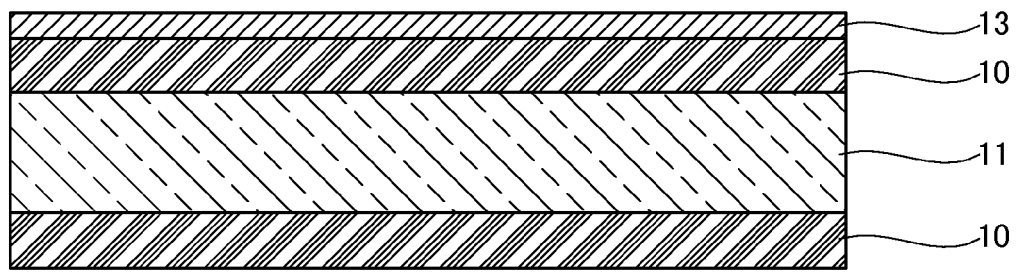
(b)
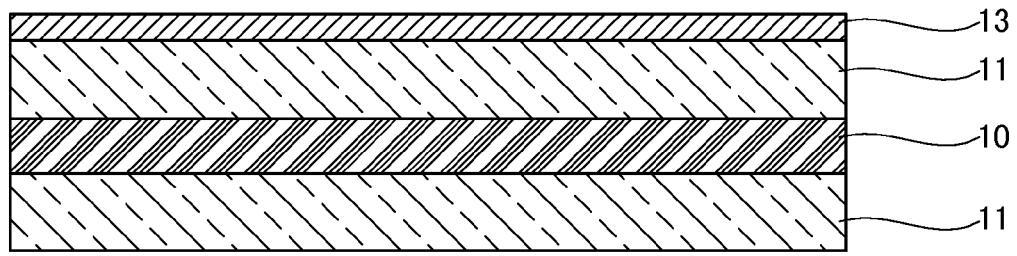
(c)

DISPLAY DEVICE AND METHOD OF MANUFACTURING THE DISPLAY DEVICE

CROSS-REFERENCE TO RELATED APPLICATIONS

This application is based upon and claims the benefit of priority from the prior Japanese Patent Application No. 2011-124295, filed on 2 Jun. 2011, the entire contents of which are incorporated herein by reference.

FIELD

The present invention relates to a display device and a method for producing the same, and specifically to a structure of a display device for electrically controlling the position of a movable shutter to display an image and a method for producing the same.

BACKGROUND

Recently, display devices for electrically controlling the position of a movable shutter to display an image (hereinafter, referred to as "movable shutter-system display devices" has been proposed. Such a movable shutter-system display device is disclosed in, for example, Japanese Laid-Open Patent Publication No. 2008-197668.

In each of pixels of a conventionally proposed movable shutter-system display device, a movable shutter is located between a pair of electrodes, and the position of the movable shutter is electrically controlled by a voltage applied to the pair of electrodes, and thus an image is displayed.

In the case where, for example, one of the pair of electrodes has a voltage of GND and the other electrode has a voltage of Vdd, the movable shutter is moved toward the other electrode among the pair of electrodes. In the case where one of the pair of electrodes has a voltage of Vdd and the other electrode has a voltage of GND, the movable shutter is moved toward the one electrode among the pair of electrodes at high speed.

When, for example, the movable shutter is moved toward the other electrode among the pair of electrodes, backlight is transmitted to put the pixel into a lit state. When the movable shutter is moved toward the one electrode among the pair of electrodes, backlight is blocked to put the pixel into a non-lit state.

In a liquid crystal display panel or a plasma display panel, an image can be displayed in this manner.

In a conventionally proposed movable shutter-system display device, an electrical signal needs to be input to the movable shutter, and therefore the movable shutter includes an amorphous silicon film doped with impurities (hereinafter, referred to as an "n+a-Si film").

When the n+a-Si film included in the movable shutter has a large residual stress, the n+a-Si film deforms a movable section of the movable shutter and prevents the movable shutter from being driven. Therefore, the movable shutter needs to include an n+a-Si film having a tensile stress, or in the case where the n+a-Si film has a compressive stress, the residual stress needs to be small.

An n+a-Si film having a compressive stress (Mpa) near "0" has both of a low sheet resistance value and a high sheet resistance value, and thus is unstable.

The movable shutter also acts as a contact layer for transmitting an electrical signal from the side of a substrate. If the contact layer is formed of an n+a-Si film having a high sheet resistance value, a high voltage is required to operate the movable section. Therefore, for the contact layer, an n+a-Si film having a low sheet resistance value is preferable.

The present invention made to solve the above-described problems of the conventional art has an object of providing a technology for forming a movable shutter of a movable shutter-system display device comprising an amorphous silicon film material which has a low residual stress and thus is stable.

The foregoing and other objects and novel features of the present invention will be made apparent by this specification and the attached drawings.

SUMMARY

A representative aspect among the aspects of the present invention may be briefly summarized as follows.

A display device includes a display panel comprising a first substrate and a second substrate. The display panel includes a plurality of pixels; each of the plurality of pixels includes a movable shutter including amorphous silicon and a driving circuit for driving the movable shutter; and the amorphous silicon included in the movable shutter is formed of at least two amorphous silicon films, and where any two amorphous silicon films adjacent to each other among the at least two amorphous silicon films are a first amorphous silicon film and a second amorphous silicon film stacked on the first amorphous silicon film, the first amorphous silicon film and the second amorphous silicon film have different characteristic values.

The movable shutter is formed on the second substrate; the amorphous silicon included in the movable shutter is formed of two amorphous silicon films, which are the first amorphous silicon film formed on the second substrate and the second amorphous silicon film stacked on the first amorphous silicon film; and the first amorphous silicon film has a refractive index higher than the refractive index of the second amorphous silicon film.

The movable shutter is formed on the second substrate; the amorphous silicon included in the movable shutter is formed of two amorphous silicon films, which are the first amorphous silicon film formed on the second substrate and the second amorphous silicon film stacked on the first amorphous silicon film; and the first amorphous silicon film has a refractive index lower than the refractive index of the second amorphous silicon film.

The movable shutter is formed on the second substrate; the amorphous silicon included in the movable shutter is formed of two amorphous silicon films, which are the first amorphous silicon film formed on the second substrate and the second amorphous silicon film stacked on the first amorphous silicon film; and the first amorphous silicon film has a sheet resistance value lower than the sheet resistance value of the second amorphous silicon film.

The movable shutter is formed on the second substrate; the amorphous silicon included in the movable shutter is formed of two amorphous silicon films, which are the first amorphous silicon film formed on the second substrate and the second amorphous silicon film stacked on the first amorphous silicon film; and the first amorphous silicon film has a sheet resistance value higher than the sheet resistance value of the second amorphous silicon film.

The movable shutter is formed on the second substrate; the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and the first amorphous silicon film and the third amorphous silicon film each have a refractive index higher than the refractive index of the second amorphous silicon film.

The movable shutter is formed on the second substrate; the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and the first amorphous silicon film and the third amorphous silicon film each have a refractive index lower than the refractive index of the second amorphous silicon film.

The movable shutter is formed on the second substrate; the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and the first amorphous silicon film and the third amorphous silicon film each have a sheet resistance value lower than the sheet resistance value of the second amorphous silicon film.

The movable shutter is formed on the second substrate; the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and the first amorphous silicon film and the third amorphous silicon film each have a sheet resistance value higher than the sheet resistance value of the second amorphous silicon film.

The movable shutter includes a metal film formed on a surface which faces the first substrate.

The movable shutter includes a blocking section; a spring section connected to the blocking section; and an anchor section connected to the spring section. The anchor section is secured on the second substrate and supports the blocking section and the spring section.

A method for producing a display device, including a display panel comprising a first substrate and a second substrate, wherein the display panel includes a plurality of pixels, and each of the plurality of pixels includes a movable shutter including amorphous silicon and a driving circuit for driving the movable shutter, comprises step 1 of forming a first resist film having a predetermined shape on the first substrate; step 2 of forming at least two amorphous silicon films on the first resist film formed in the step 1; step 3 of forming a second resist film having a prescribed shape on the at least two amorphous silicon films; step 4 of etching the at least two amorphous silicon films using the second resist film as a mask; and step 5 of deleting the first resist film formed in the step 1. Where any two amorphous silicon films adjacent to each other among the at least two amorphous silicon films formed in the step 2 are a first amorphous silicon film and a second amorphous silicon film stacked on the first amorphous silicon film, the first amorphous silicon film and the second amorphous silicon film are formed under different film formation conditions.

The step 2 includes step 21 of forming the first amorphous silicon film on the first resist film formed in the step 1; step 22 of forming the second amorphous silicon film under a different film formation condition from that in the step 21; and step 23 of forming a third amorphous silicon film under a different film formation condition from that in the step 22.

The method for producing the display device further comprises a step of forming a metal film on the amorphous silicon films formed in the step 2. In the step 3, the second resist film is formed on the metal film which is formed on the amorphous silicon films; and the step 4 is a step of etching the amorphous silicon films and the metal film formed in the step 2 using the second resist film as a mask.

BRIEF DESCRIPTION OF DRAWINGS

FIG. 8 provides cross-sectional views each showing a structure of an amorphous silicon film material included in the movable shutter in the example according to the present invention;

DESCRIPTION OF EMBODIMENTS

Figure 1:
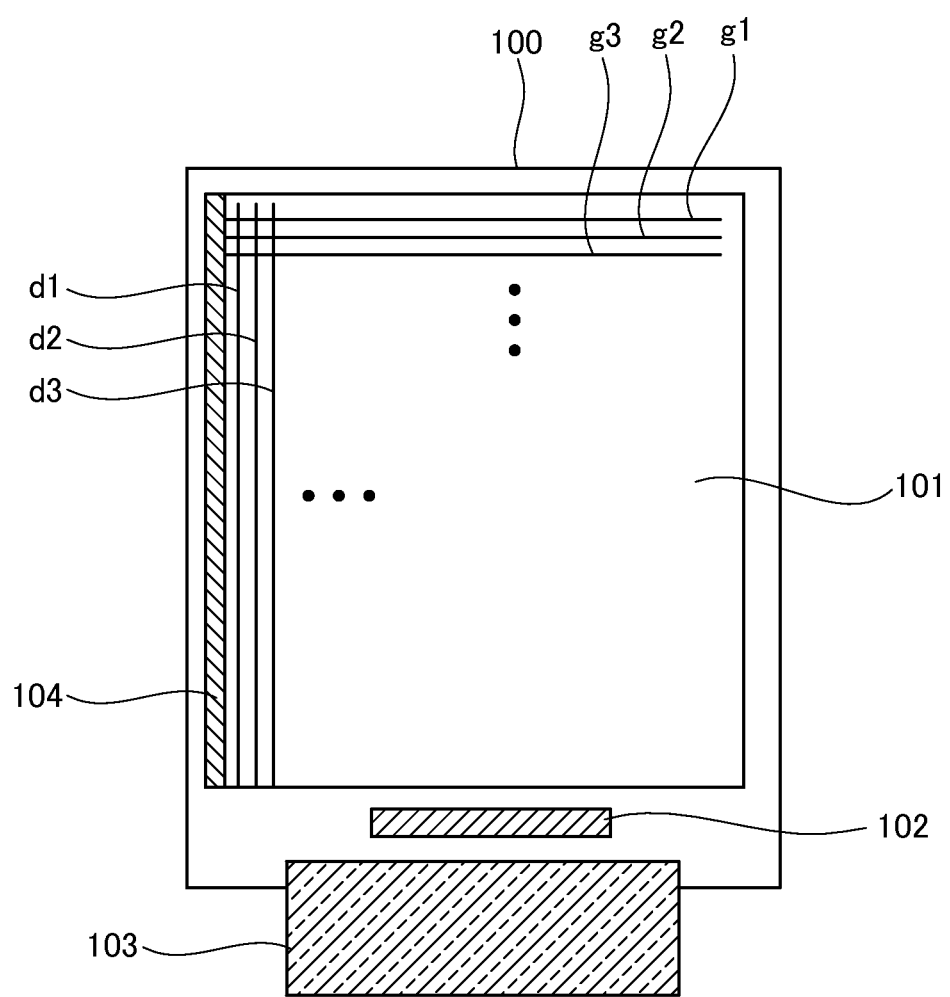
FIG. 1 is a schematic view showing a structure of a display device as a premise of the present invention.

Hereinafter, embodiments of the present invention will be described with reference to the drawings.

In all the drawings attached herewith to explain the embodiments, elements having the same function will bear the same reference numerals, and will not be described repeatedly. The following embodiments do not limit the interpretations on the scope of the claims of the present invention. In the following description, it will be understood that when an element or a layer is referred to as being "on" another element or layer, it can be directly on the other element or layer, or intervening layers or elements may also be present.

[Display Device as a Premise of the Present Invention]

FIG. 1 is a schematic view showing a structure of a display panel of a display device as a premise of the present invention. In FIG. 1, reference numeral 100 represents a display panel. The display panel 100 includes a scanning line driving circuit 104 and a video line driving circuit 102. To the display panel 100, display data and display control signals are input from an external device via a flexible substrate 103.

In FIG. 1, reference numeral 101 represents a display area. In the display area 101, a plurality of scanning lines (g1, g2, g3, . . . ) each supplied with a selective scanning signal from the scanning line driving circuit 104, and a plurality of video lines (d1, d2, d3, . . . ) each supplied with a data voltage from the video line driving circuit 102, are located.

Like in a liquid crystal display panel or the like, pixels are located at intersections of the scanning lines (g1, g2, g3, . . . ) and the video lines (d1, d2, d3, . . . ).

The scanning line driving circuit 104 and the video line driving circuit 102 may each be formed of a circuit mounted on a semiconductor chip which is mounted on a substrate. Alternatively, the scanning line driving circuit 104 and the video line driving circuit 102 may each be formed of a thin film transistor which is formed on a substrate and includes a semiconductor layer including a polycrystalline silicon layer.

Figure 2:
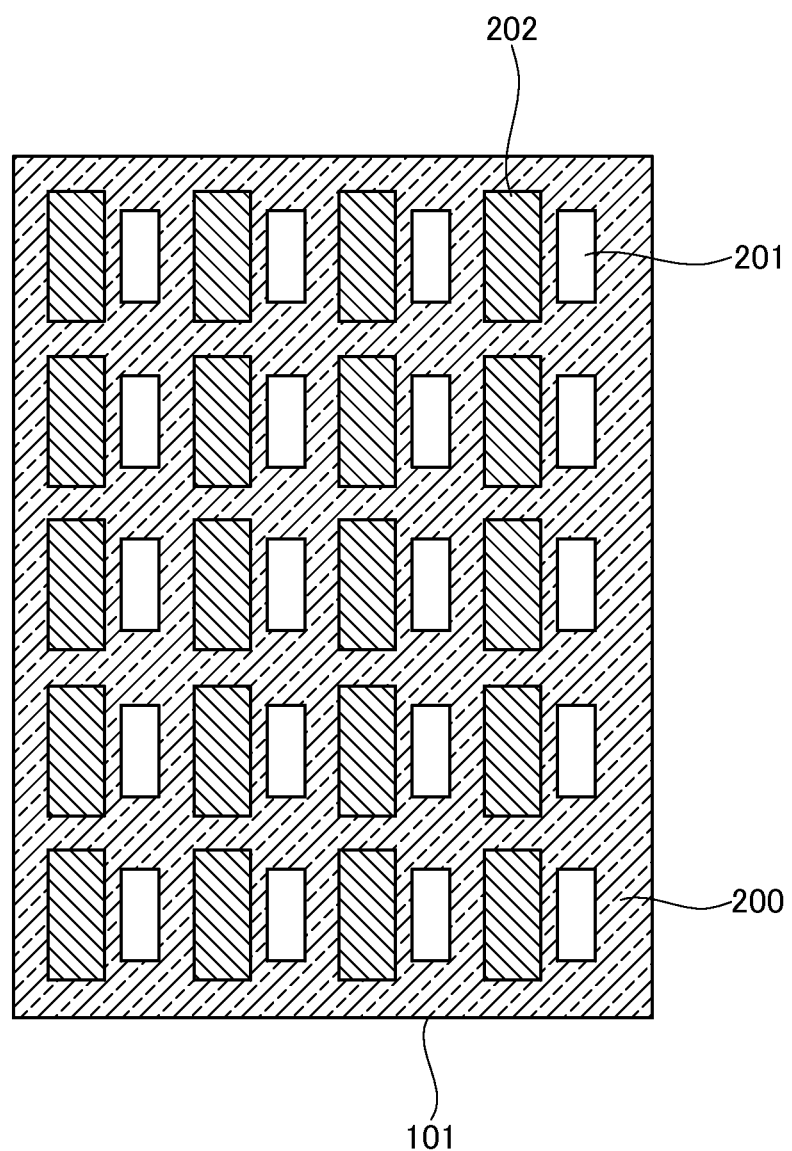
FIG. 2 is provided to explain the display principle of the display device as a premise of the present invention.

FIG. 2 is provided to explain the display principle of the display device as a premise of the present invention.

As shown in FIG. 2, the display area 101 of a first substrate 200 has a plurality of openings 201. Each of the openings 201 is controlled to be opened or closed by a corresponding movable shutter 202.

FIG. 2 shows a state where all the openings are opened. When any movable shutter 202 covers the corresponding opening 201, the opening is closed. In the state where, for example, any movable shutter 202 allows the corresponding opening 201 to be opened, backlight is transmitted to put the corresponding pixel into a lit state. In the state where any movable shutter 202 covers the corresponding opening 201, the backlight is blocked to put the corresponding pixel into a non-lit state. In this manner, an image is displayed.

Figure 3:
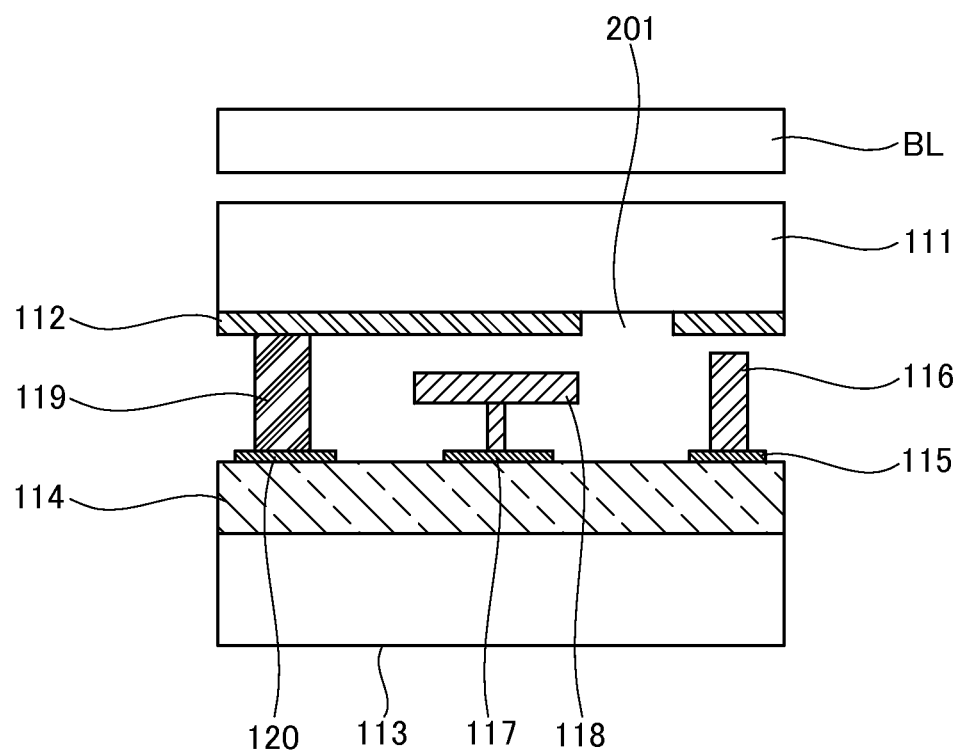
FIG. 3 is a schematic view showing a cross-sectional structure of an example of display device as a premise of the present invention.
Figure 4:
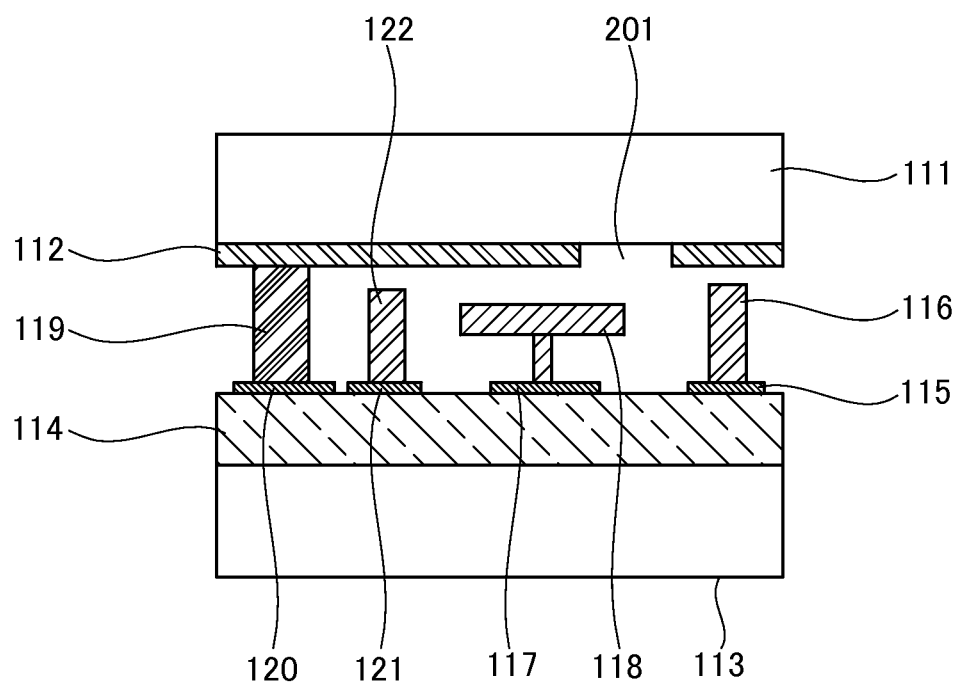
FIG. 4 is a schematic view showing a cross-sectional structure of another example of display device as a premise of the present invention.

FIG. 3 is a schematic view showing a cross-sectional structure of an example of display device as a premise of the present invention, and FIG. 4 is a schematic view showing a cross-sectional structure of another example of display device as a premise of the present invention.

In FIG. 3 and FIG. 4, reference numeral 111 represents a first substrate (counter substrate), and reference numeral 113 represents a second substrate (MEMS substrate). On the first substrate 111, a light blocking film 112 is formed except for the opening 201. As shown in FIG. 3, a backlight device (BL) is located on the first substrate 111 side.

On the second substrate 113, a TFT circuit formation section 114 is provided. The TFT circuit formation section 114 includes a latch circuit and the like (not shown). A transistor included in the TFT circuit formation section 114 is formed of a thin film transistor including a semiconductor layer which includes a polycrystalline silicon layer.

On the TFT circuit formation section 114, a movable shutter 118 is located. The movable shutter 118 is supplied with a predetermined voltage via a contact section 117.

In FIG. 3, an electrode 116 is provided on the TFT circuit formation section 114. The electrode 116 is supplied with one of two output voltages which are output from the latch circuit (not shown), via the contact section 115. In FIG. 3, an electrical field is applied between the movable shutter 118 and the electrode 116, and thus the movable shutter 118 is moved toward the electrode 116.

In FIG. 4, the electrode 116 and an electrode 122 are provided on the TFT circuit formation section 114. The electrode 116 is supplied with one of two output voltages which are output from the latch circuit (not shown), via the contact section 115. The electrode 122 is supplied with the other of the two output voltages which are output from the latch circuit (not shown), via a contact section 121.

In FIG. 4, an electrical field is applied between the movable shutter 118 and the electrode 116, and thus the movable shutter 118 is moved toward the electrode 116. Similarly, an electrical field is applied between the movable shutter 118 and the electrode 122, and thus the movable shutter 118 is moved toward the electrode 122.

In FIG. 3 and FIG. 4, reference numeral 119 represents a sealing member, and reference numeral 120 represents a contact section located between the sealing member 119 and the TFT circuit formation section 114. FIG. 3 and FIG. 4 each show a structure of one pixel.

Figure 5:
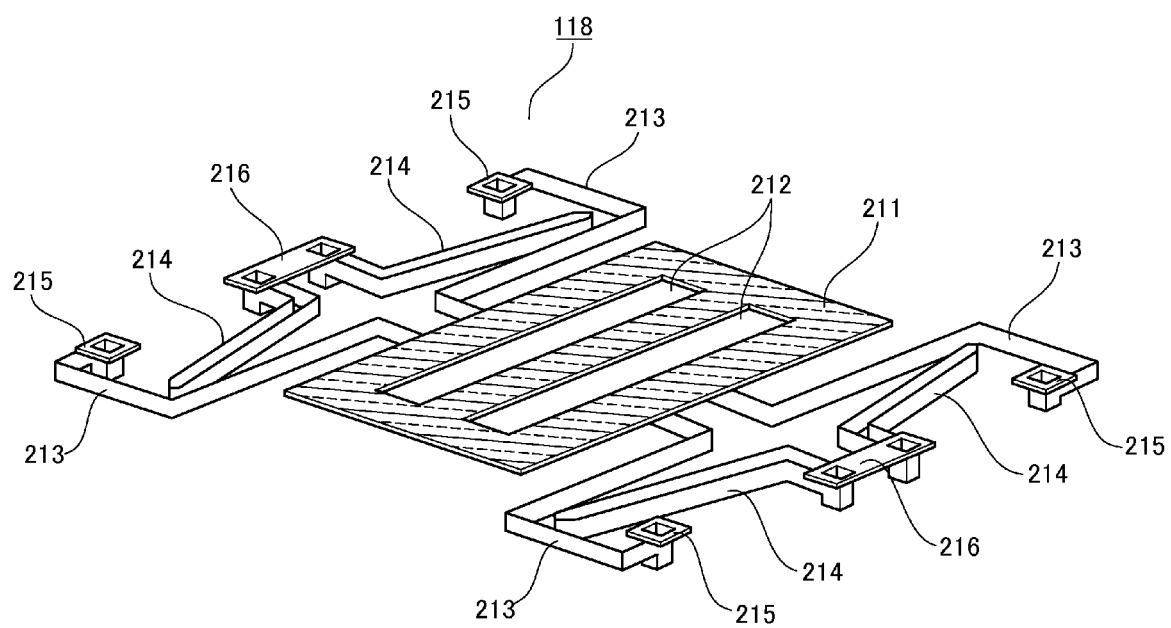
FIG. 5 is a perspective view showing an example of movable shutter shown in FIG. 4.
Figure 6:
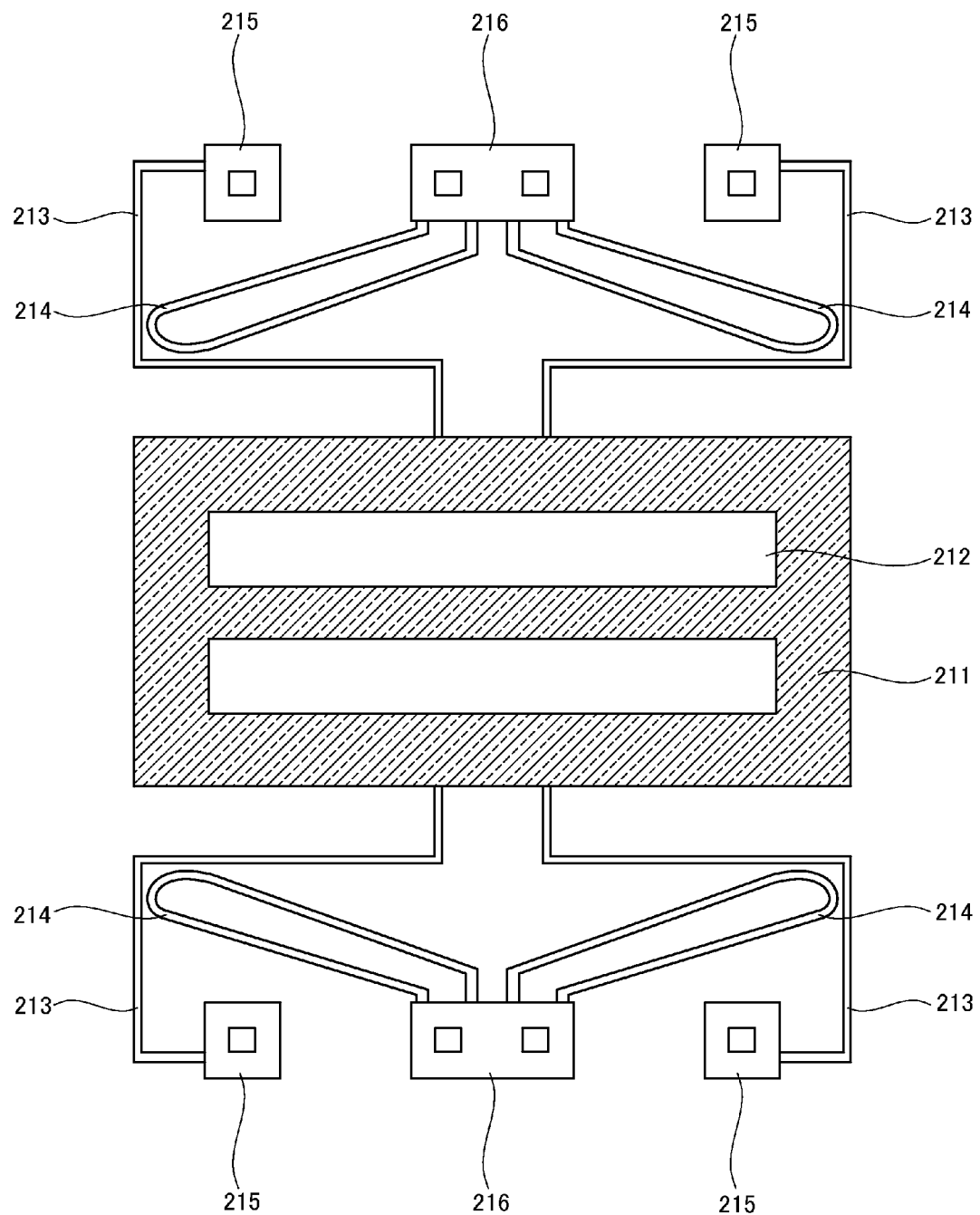
FIG. 6 is a plan view of the movable shutter shown in FIG. 5.

FIG. 5 is a perspective view showing an example of the movable shutter 118 shown in FIG. 4, and FIG. 6 is a plan view of the movable shutter 118 shown in FIG. 5.

In FIG. 5 and FIG. 6, reference numeral 211 represents a blocking section of the movable shutter 118, reference numeral 212 represents openings of the movable shutter 118, reference numeral 213 represents first springs, and reference numeral 214 represents second springs, and reference numerals 215 and 216 represent anchor sections.

The anchor sections 215 act both as a section for securing the blocking section 211 and the first springs 213 of the movable shutter 118 to the second substrate 113 and as a section for supplying electric power to the blocking section 211 and the first springs 213 of the movable shutter 118 from the TFT circuit formation section 114. The first springs 213 cause the blocking section 211 and the openings 212 of the movable shutter 118 to float in the air.

The first springs 213 corresponds to the electrode 116 and the electrode 122. The anchor sections 216 act both as a section for securing the second springs 214 to the second substrate 113 and as a section for supplying electric power to the second springs 214 from the TFT circuit formation section 114.

By an electrical field applied between the first springs 213 and the second springs 214, the first springs 213 are moved toward the second springs 214. As a result, the blocking section 211 and the openings 212 of the movable shutter 118 are moved.

With the movable shutter 118 shown in FIG. 5 and FIG. 6, the blocking section 211 of the movable shutter 118 covers the opening 201 formed in the first substrate 111, and thus the pixel is put into a non-lit state.

In the movable shutter-system display device as a premise of the present invention, an electrical signal needs to be input to the movable shutter. Therefore, the movable shutter includes an amorphous silicon film material doped with impurities (hereinafter, referred to as an "n+a-Si film material").

EXAMPLES

Figure 7A:
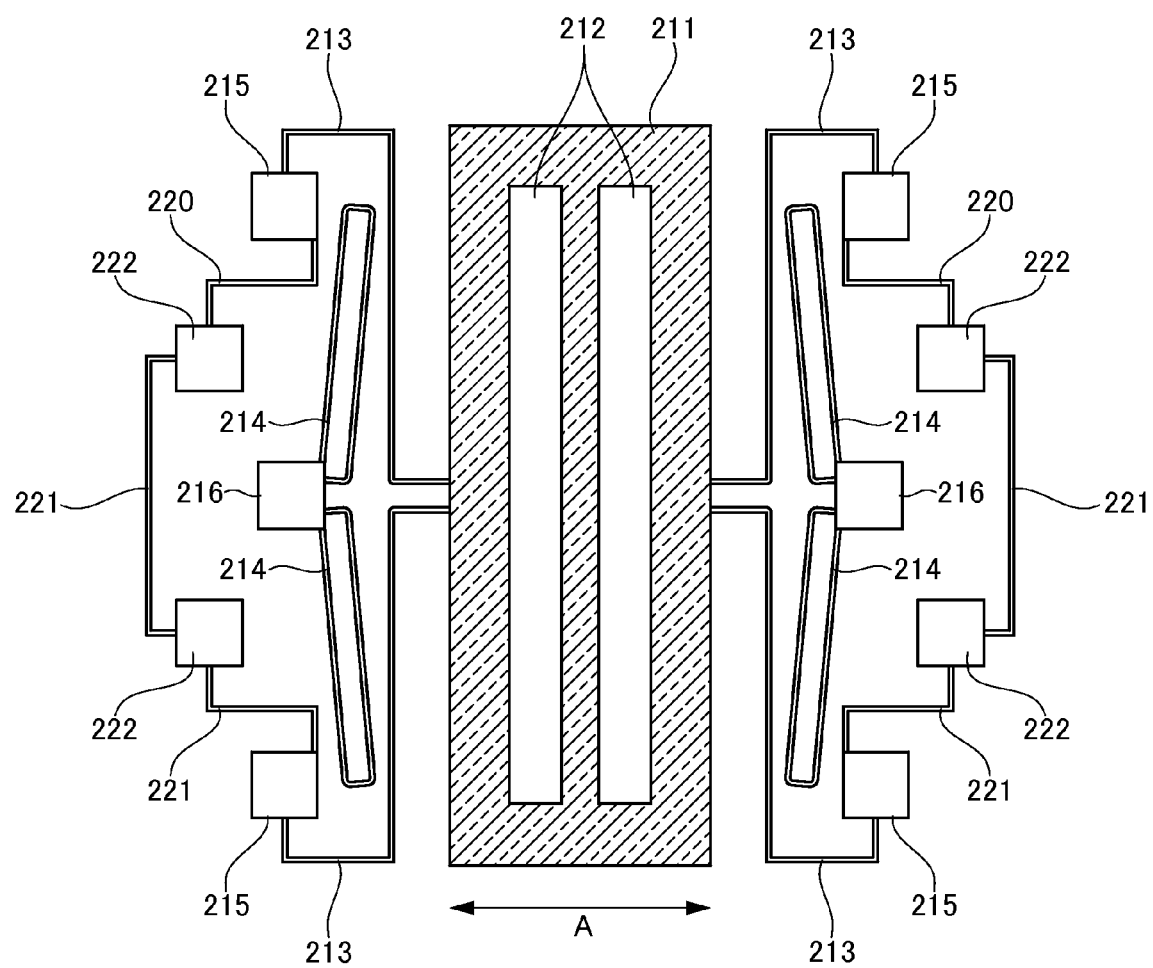
FIG. 7A is a plan view of a movable shutter in an example according to the present invention.
Figure 7B:
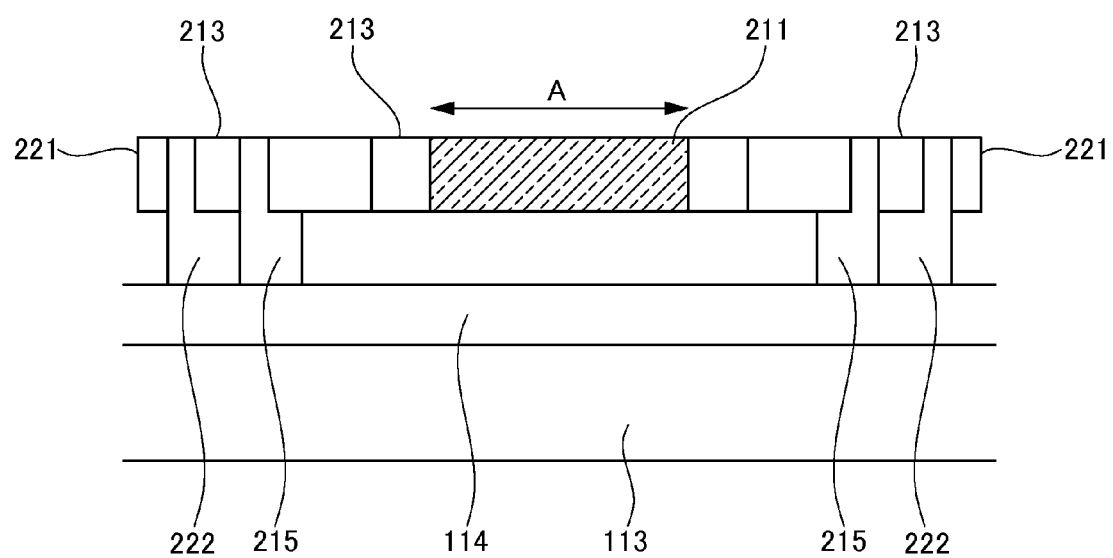
FIG. 7B is a side view of the movable shutter in the example according to the present invention.

FIG. 7 shows views of a movable shutter in an example according to the present invention. FIG. 7A is a plan view of the movable shutter, and FIG. 7B is a side view thereof.

The movable shutter 118 includes anchor sections 222 and connection sections 220 and 221 in addition to the elements included in the movable shutter 118 shown in FIG. 5.

In this example, either the anchor sections 215 or 222 are supplied with electric power from the TFT circuit formation section 114, and thus the movable shutter 118 is supplied with electric power.

In this example also, the movable shutter includes an n+a-Si film material doped with impurities. In this example, however, the n+a-Si film material included in the movable shutter includes at least two amorphous silicon films provided in a stacked manner. Where two amorphous silicon films adjacent to each other are a first amorphous silicon film A and a second amorphous silicon film B stacked on the first amorphous silicon film A, the first amorphous silicon film A and the second amorphous silicon film B have different characteristic values.

In this example, for example, as shown in FIG. 8(a), the movable shutter includes two n+a-Si films provided in a stacked manner, i.e., an n+a-Si film 10 having a low sheet resistance value and an n+a-Si film 11 having a high sheet resistance value. In FIG. 8, reference numeral 13 represents a metal film acting as a reflective film.

Figure 9:
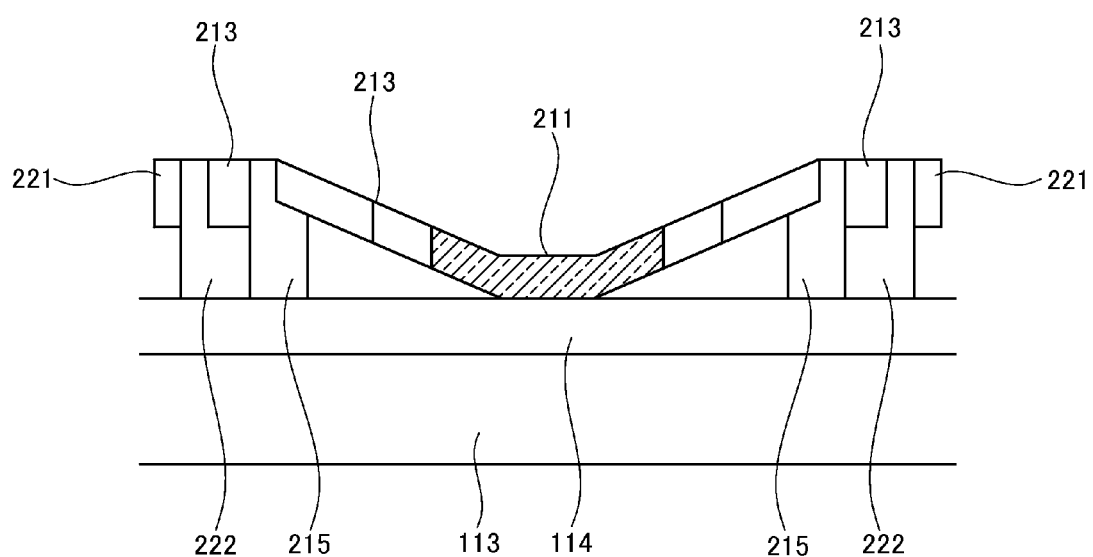
FIG. 9 is a view illustrating a problem of a movable shutter of the display device as a premise of the present invention.

The n+a-Si film having a low sheet resistance value has a dense crystalline structure and thus a large compressive stress. Therefore, when the movable shutter is formed of an n+a-Si film having a low sheet resistance value, there is an undesirable possibility that, as shown in FIG. 9, the movable shutter is deformed and a movable section of the movable shutter contacts the TFT circuit formation section 114, which prevents the movable shutter from being driven in a worst case.

Figure 10:
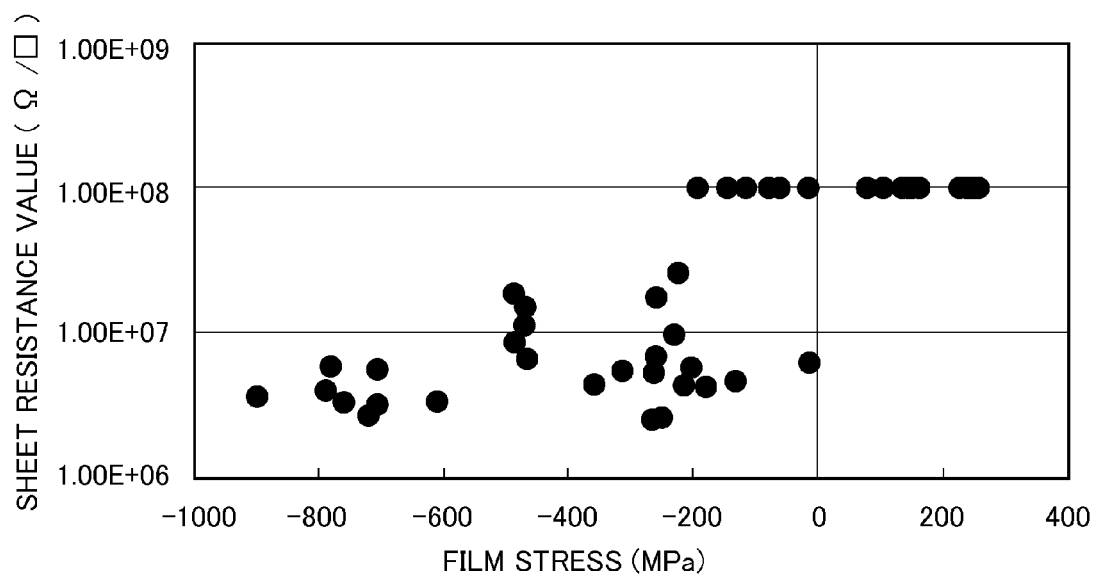
FIG. 10 is a graph showing the relationship between the film stress (Mpa) and the sheet resistance value of an amorphous silicon film.

As shown in FIG. 10, an n+a-Si film having a compressive stress (Mpa) near "0" has both of a low sheet resistance value and a high sheet resistance value, and thus is unstable.

By contrast, in this example, as shown in FIG. 8(a), the movable shutter includes the n+a-Si film 10 having a low sheet resistance value and the n+a-Si film 11 having a high sheet resistance value provided in a stacked manner.

As shown in FIG. 10, the n+a-Si film 10 having a low sheet resistance value has a large compressive stress, whereas the n+a-Si film 11 having a high sheet resistance value has a large tensile stress. By controlling the thickness of the n+a-Si film 10 and the thickness of the n+a-Si film 11, the film stress (Mpa) of the entire n+a-Si film material can be made near "0". In addition, the sheet resistance value of the entire n+a-Si film material is determined by the n+a-Si film 10 having a low sheet resistance value. Thus, in this example, the sheet resistance value and the film stress (Mpa) of the entire n+a-Si film material can be controlled separately, and therefore ranges for the film formation conditions can be broadened.

FIG. 10 is a graph showing the relationship between the film stress (Mpa) and the sheet resistance value (Q/□) of an n+a-Si film.

Especially when the n+a-Si film 10 having a low sheet resistance value is provided as a lower layer, the anchor sections 215 and 222 can have a low sheet resistance value on the side thereof which is in contact with the TFT circuit formation section 114. This can decrease the voltage to be input to the anchor sections 215 and 222 in order to operate the movable shutter. In this specification, a "low sheet resistance value" means a sheet resistance value less than 10 M (Q/□), and a "high sheet resistance value" means a sheet resistance value more than or equal to 10 M (Q/□).

The n+a-Si film 10 having a low sheet resistance value has a dense crystalline structure, whereas the n+a-Si film 11 having a high sheet resistance value does not have a very dense crystalline structure. Thus, the n+a-Si film 10 and the n+a-Si film 11 have different refractive indices. Specifically, the n+a-Si film 10 having a low sheet resistance value has a dense crystalline structure, and thus the refractive index thereof is higher than that of the n+a-Si film 11 having a high sheet resistance value.

Figure 11:
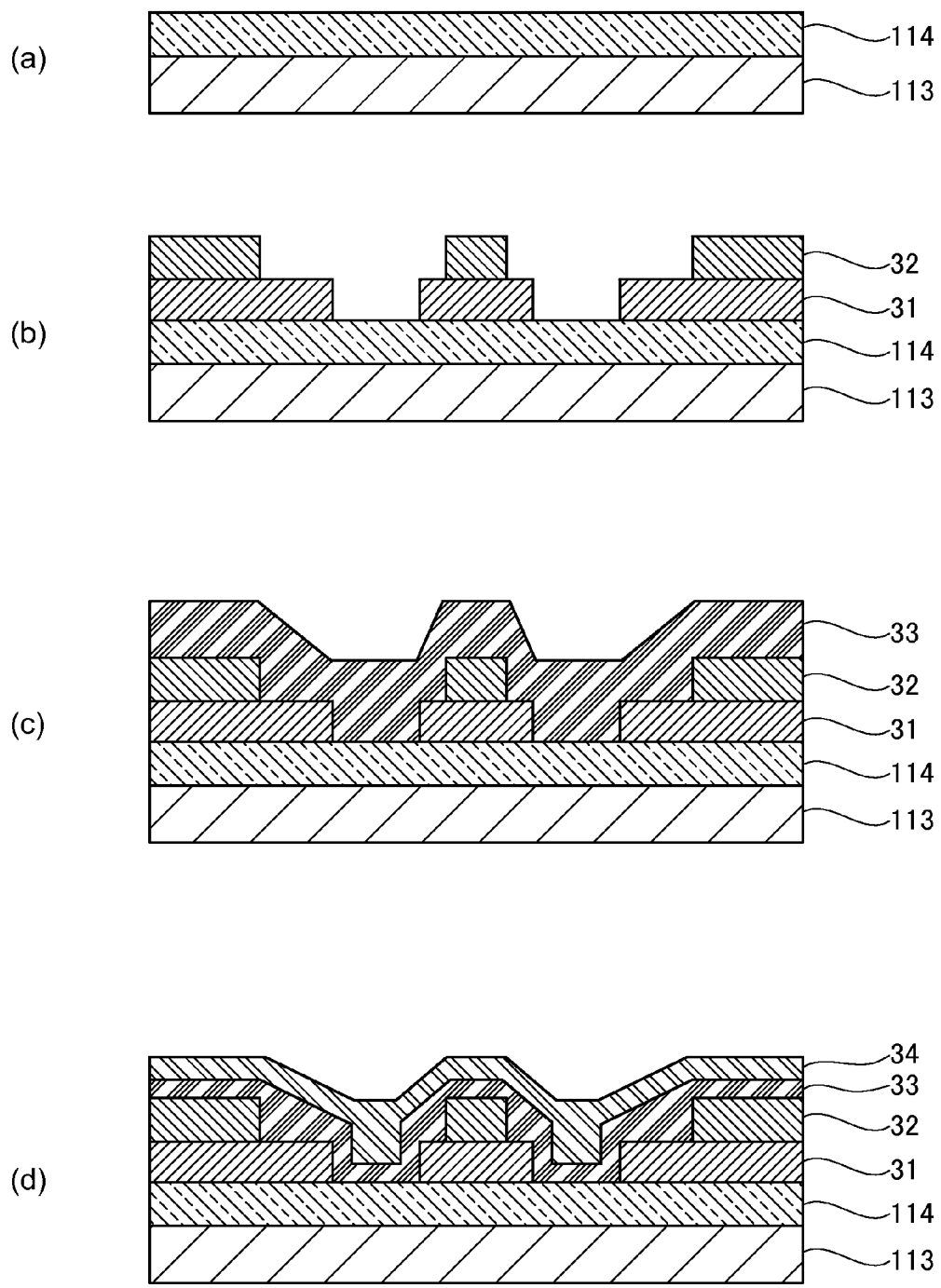
FIG. 11 provides views showing a method for producing the movable shutter in the example according to the present invention.
Figure 12:
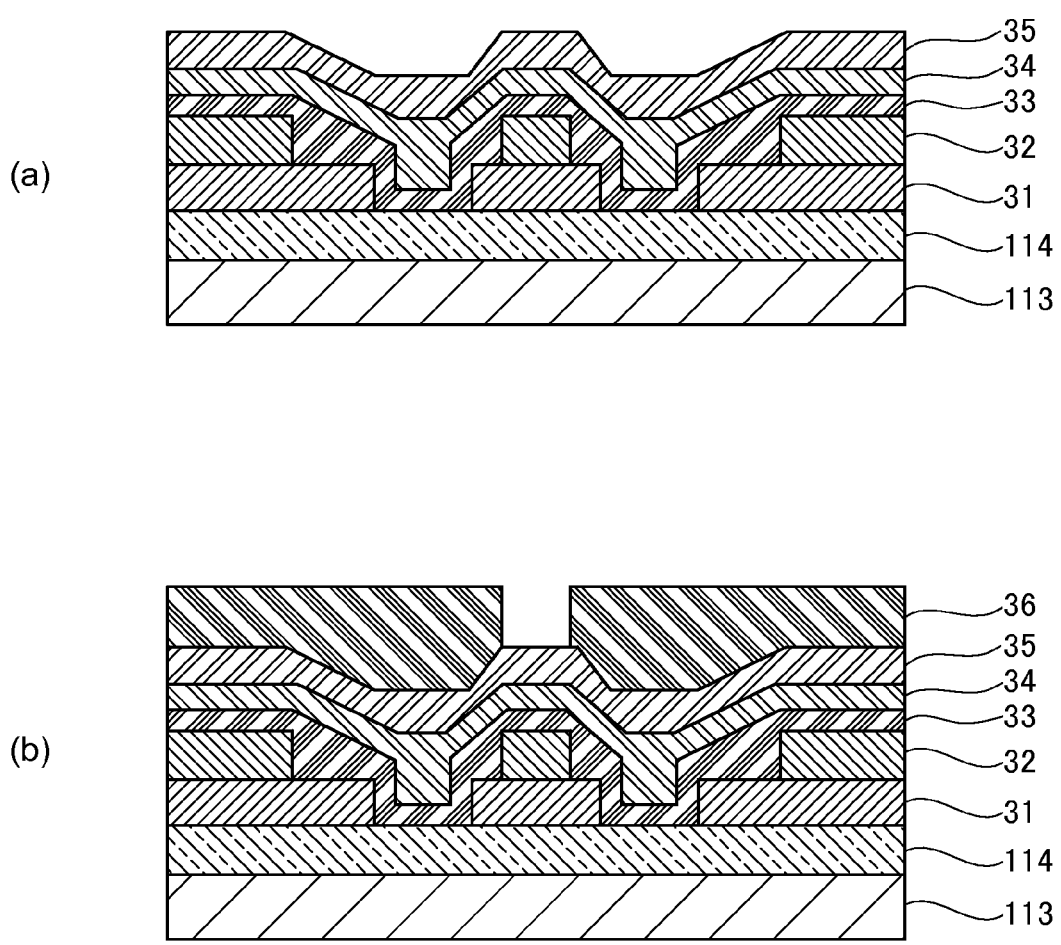
FIG. 12 provides views showing the method for producing the movable shutter in the example according to the present invention.
Figure 13:
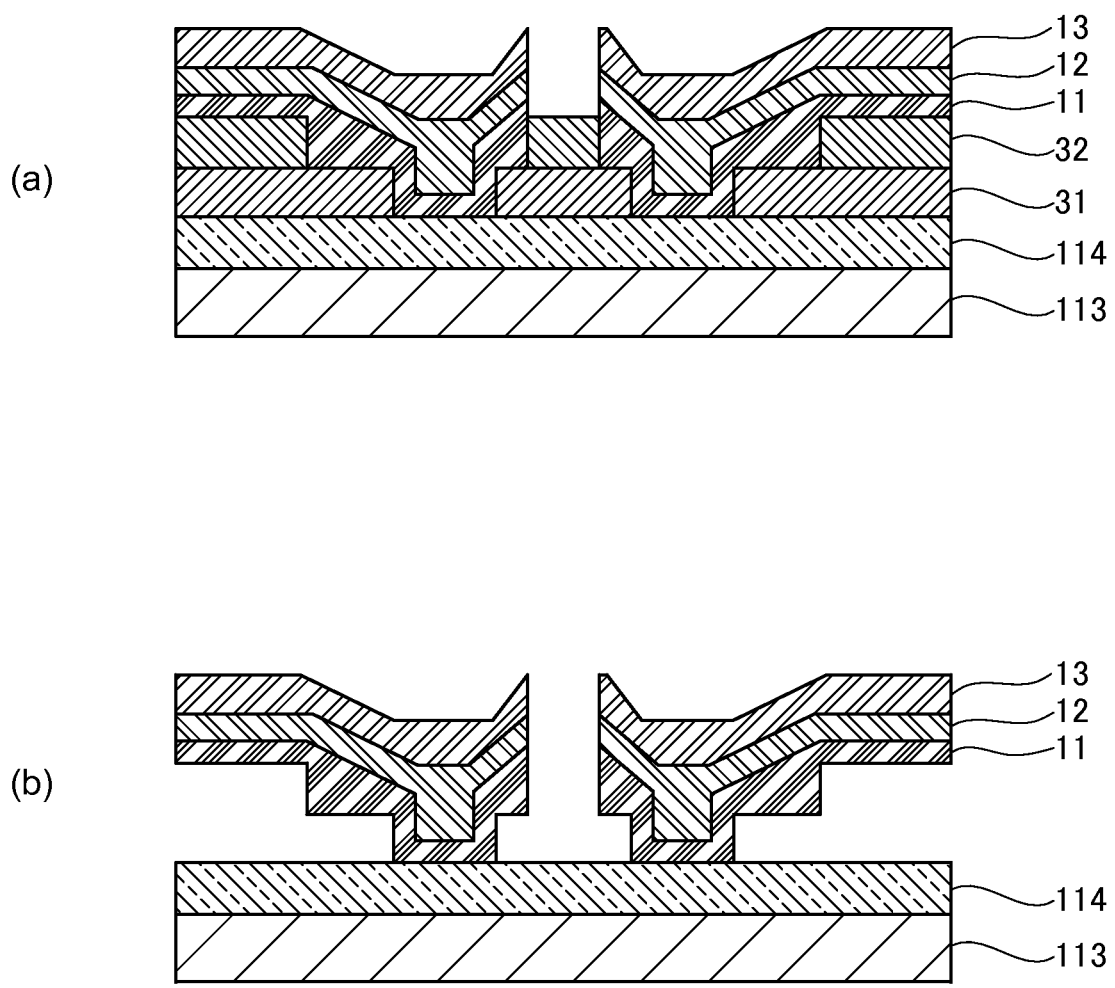
FIG. 13 provides views showing the method for producing the movable shutter in the example according to the present invention.

FIG. 11 through FIG. 13 are views showing production steps of the movable shutter in this example.

Hereinafter, with reference to FIG. 11 through FIG. 13, a method for producing the movable shutter in this example will be described.

First, on the second substrate 113, the TFT circuit formation section 114 is formed (FIG. 11, (a)).

Next, on the TFT circuit formation section 114, an anchor resist film 31 and a movable shutter resist film 32 are formed by photolithography (FIG. 11, (b)).

Next, on the anchor resist film 31 and the movable shutter resist film 32, a first n+a-Si film 33 is formed by CVD (FIG. 11, (c)). The first n+a-Si film 33 formed in this step has a low sheet resistance value and a large compressive stress.

Next, on the first n+a-Si film 33, a second n+a-Si film 34 is formed by CVD under different film formation conditions from those for the first n+a-Si film 33 (FIG. 11, (d)). The second n+a-Si film 34 formed in this step has a high sheet resistance value and a large tensile stress.

The first n+a-Si film 33 and the second n+a-Si film 34 are formed sequentially in the same processing chamber under different film formation conditions.

For example, the first n+a-Si film 33 and the second n+a-Si film 34 are formed under the film formation conditions shown in Table 1 below.

TABLE 1

| Item | Unit | 1st n + a-Si film | 2nd n + a-Si film |
|---|---|---|---|
| SiH$_4$ | ml/min | 40 | 50 |
| H$_2$ | ml/min | 300 | 300 |
| PH$_3$ | ml/min | 15 | 30 |
| Pressure | Pa | 290 | 260 |
| RF power | W | 20 | 30 |
| Film formation rate | nm/s | 0.57 | 1.38 |

Next, on the second n+a-Si film 34, a metal film (AlSi) 35 acting as a reflective film is formed (FIG. 12, (a)).

Next, on the metal film 35, a resist film 36 for forming a movable shutter pattern is formed (FIG. 12, (b)).

Next, etching is performed using the resist film 36 as a mask to form the movable shutter pattern including the first n+a-Si film 10, the second n+a-Si film 11, and the metal film 13 (FIG. 13, (a)).

In a final step, the anchor resist film 31 and the movable shutter resist film 32 formed on the TFT circuit formation section 114 are removed to form the movable shutter including the blocking sections 211, the first springs 231, the anchor sections 215 and 222, and the connection sections 220 and 221 (FIG. 13, (b)).

In the above description, the amorphous silicon film material included in the movable shutter has a two-layer structure including the n+a-Si film 10 having a low sheet resistance value provided as a lower layer (on the side of the second substrate 113) and the n+a-Si film 11 having a high sheet resistance value provided as an upper layer. In the case where the movable shutter is to be merely formed of an amorphous silicon film material having a film stress (Mpa) near "0" and a stable sheet resistance value, the amorphous silicon film material may have a two-layer structure including the n+a-Si film 11 having a high sheet resistance value provided as a lower layer (on the side of the second substrate 113) and the n+a-Si film 10 having a low sheet resistance value provided as an upper layer.

As shown in FIG. 8, (b), the amorphous silicon film material included in the movable shutter may have a three-layer structure including the n+a-Si film 10 having a low sheet resistance, the n+a-Si film 11 having a high sheet resistance, and the n+a-Si film 10 having a low sheet resistance provided in this order from the side of the second substrate 113. Alternatively, as shown in FIG. 8, (c), the amorphous silicon film material included in the movable shutter may have a three-layer structure including the n+a-Si film 11 having a high sheet resistance, the n+a-Si film 10 having a low sheet resistance, and the n+a-Si film 11 having a high sheet resistance provided in this order from the side of the second substrate 113.

Still alternatively, the amorphous silicon film material included in the movable shutter may include four or more n+a-Si films provided in a stacked manner, among which any two n+a-Si films adjacent to each other have different characteristic values.

As described above, this example provides the following functions and effects.

(1) The n+a-Si film material included in the movable shutter is formed of a plurality of n+a-Si films, so that the film stress of the entire n+a-Si film material can be controlled. Namely, an n+a-Si film having a low sheet resistance value (compressive stress) and an n+a-Si film having a high sheet resistance value (tensile stress) are provided in a stacked manner, and the thickness of both of the films is controlled. As a result, the stress of the entire film material can be controlled.

(2) Specifically, the n+a-Si film material included in the movable shutter may be formed of two n+a-Si films such that the n+a-Si film having a low sheet resistance value is provided as a lower layer and the n+a-Si film having a high sheet resistance value is stacked thereon as an upper layer. In this case, the n+a-Si film having a low sheet resistance value provided as the lower layer receives an electrical signal from the TFT circuit formation section 114. Since the n+a-Si film having a high sheet resistance value provided as the upper layer has a tensile stress, the entire n+a-Si film material has a low sheet resistance value and a tensile stress.

(3) Also in the case where the n+a-Si film material included in the movable shutter is formed of two n+a-Si films as described above, the film of the lower layer can be formed under a condition which causes the film to have a low sheet resistance value, and the film of the upper layer can be formed under a condition which causes the film to have a tensile stress with no consideration of the sheet resistance value. With such a manner of film formation, each film does not need to fulfill both of the condition regarding the sheet resistance value and the condition regarding the stress. As a result, ranges for the film formation conditions are broadened.

As can be understood from the above, an effect provided by a representative aspect among the aspects of the present invention is, briefly describing, that a movable shutter of a movable shutter-system display device can be formed by using an amorphous silicon film material which has a low residual stress and thus is stable.

The invention made by the present inventors has been described by way of examples. The present invention is not limited to the above-provided examples and may be modified in any of various manners without departing from the scope of the gist of the invention.

What is claimed is:

1. A display device including:
   a display panel comprising a first substrate and a second substrate, wherein:
      the display panel includes a plurality of pixels;
      each of the plurality of pixels includes a movable shutter including amorphous silicon and a driving circuit for driving the movable shutter; and
      the amorphous silicon included in the movable shutter is formed of at least two amorphous silicon films, and where any two amorphous silicon films adjacent to each other among the at least two amorphous silicon films are a first amorphous silicon film and a second amorphous silicon film stacked on the first amorphous silicon film, the first amorphous silicon film and the second amorphous silicon film have different characteristic values.

2. A display device according to claim 1, wherein:
   the movable shutter is formed on the second substrate;
   the amorphous silicon included in the movable shutter is formed of two amorphous silicon films, which are the first amorphous silicon film formed on the second substrate and the second amorphous silicon film stacked on the first amorphous silicon film; and
   the first amorphous silicon film has a refractive index higher than the refractive index of the second amorphous silicon film.

3. A display device according to claim 1, wherein:
   the movable shutter is formed on the second substrate;
   the amorphous silicon included in the movable shutter is formed of two amorphous silicon films, which are the first amorphous silicon film formed on the second substrate and the second amorphous silicon film stacked on the first amorphous silicon film; and
   the first amorphous silicon film has a refractive index lower than the refractive index of the second amorphous silicon film.

4. A display device according to claim 1, wherein:
   the movable shutter is formed on the second substrate;
   the amorphous silicon included in the movable shutter is formed of two amorphous silicon films, which are the first amorphous silicon film formed on the second substrate and the second amorphous silicon film stacked on the first amorphous silicon film; and
   the first amorphous silicon film has a sheet resistance value lower than the sheet resistance value of the second amorphous silicon film.

5. A display device according to claim 1, wherein:
   the movable shutter is formed on the second substrate;
   the amorphous silicon included in the movable shutter is formed of two amorphous silicon films, which are the first amorphous silicon film formed on the second substrate and the second amorphous silicon film stacked on the first amorphous silicon film; and
   the first amorphous silicon film has a sheet resistance value higher than the sheet resistance value of the second amorphous silicon film.

6. A display device according to claim 1, wherein:
   the movable shutter is formed on the second substrate;
   the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and
   the first amorphous silicon film and the third amorphous silicon film each have a refractive index higher than the refractive index of the second amorphous silicon film.

7. A display device according to claim 1, wherein:
   the movable shutter is formed on the second substrate;
   the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and
   the first amorphous silicon film and the third amorphous silicon film each have a refractive index lower than the refractive index of the second amorphous silicon film.

8. A display device according to claim 1, wherein:
the movable shutter is formed on the second substrate;
the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and
the first amorphous silicon film and the third amorphous silicon film each have a sheet resistance value lower than the sheet resistance value of the second amorphous silicon film.

9. A display device according to claim 1, wherein:
the movable shutter is formed on the second substrate;
the amorphous silicon included in the movable shutter is formed of three amorphous silicon films, which are the first amorphous silicon film formed on the second substrate, the second amorphous silicon film stacked on the first amorphous silicon film, and a third amorphous silicon film stacked on the second amorphous silicon film; and
the first amorphous silicon film and the third amorphous silicon film each have a sheet resistance value higher than the sheet resistance value of the second amorphous silicon film.

10. A display device according to claim 1, wherein the movable shutter includes a metal film formed on a surface which faces the first substrate.

11. A display device according to claim 1, wherein the movable shutter includes:
a blocking section;
a spring section connected to the blocking section; and
an anchor section connected to the spring section;
wherein the anchor section is secured on the second substrate and supports the blocking section and the spring section.

* * * * *